United States Patent [19]

Zhao et al.

[11] Patent Number: 5,674,787

[45] Date of Patent: Oct. 7, 1997

[54] SELECTIVE ELECTROLESS COPPER DEPOSITED INTERCONNECT PLUGS FOR ULSI APPLICATIONS

[75] Inventors: Bin Zhao; Prahalad K. Vasudev, both of Austin, Tex.; Valery M. Dubin, Cupertino, Calif.; Yosef Shacham-Diamand, Ithaca, N.Y.; Chiu H. Ting, Saratoga, Calif.

[73] Assignee: Sematech, Inc., Austin, Tex.

[21] Appl. No.: 587,263

[22] Filed: Jan. 16, 1996

[51] Int. Cl.$^6$ ................................................. H01L 21/28
[52] U.S. Cl. ........................... 437/230; 437/187; 437/190; 437/195
[58] Field of Search ................................ 437/187, 190, 437/195, 198, 230

[56] References Cited

U.S. PATENT DOCUMENTS

| | | | |
|---|---|---|---|
| 4,574,095 | 3/1986 | Baum et al. | 427/53.1 |
| 4,789,648 | 12/1988 | Chow et al. | 437/225 |
| 4,894,260 | 1/1990 | Kumasaka et al. | 427/241 |
| 4,985,750 | 1/1991 | Hoshino | 357/71 |
| 5,151,168 | 9/1992 | Gilton et al. | 205/123 |
| 5,240,497 | 8/1993 | Shacham et al. | 106/1.26 |

OTHER PUBLICATIONS

"Copper Interconnection with Tungsten Cladding for ULSI;" J.S.H. Cho et al.; VLSI Tech. Symp.; 1991; pp. 39–40.

"Encapsulated Copper Interconnection Devices Using Sidewall Barriers;" Donald S. Gardner et al.; 1991 VMIC Conference; Jun. 11–12, 1991; pp. 99–108.

"Planar Copper–Polyimide Back End Of The Line Interconnections For ULSI Devices;" B. Luther et al.; 1993 VMIC Conference; Jun. 8–9, 1993; pp. 15–21.

"Electroless Cu for VLSI;" James S.H. Cho et al.; MRS Bulletin/Jun. 1993; pp. 31–38.

"Electroless Copper Deposition on Metals and Metal Silicides;" Cecilia Y. Mak; MRS Bulletin/Aug. 1994; pp. 55–62.

"Development Of An Electroless Copper Deposition Bath For Via Fill Applications On TiN Seed Layers;" Roger Palmans et al.; Conf. Proc. ULSI-X; Material Research Society; 1995; pp. 87–94.

"Selective and Blanket Electroless Cu Plating Initiated By Contact Displacement For Deep Submicron Via Contact Filling;" Dubin et al.; VMIC Conf.; Jun. 27–29, 1995; pp. 315–321.

"0.35 um Cu–Filled Via Holes By Blanket Deposited Electroless Copper On Sputtered Seed Layer;" Yosi Shacham-Diamand et al.; VMIC Conf.; Jun. 27–29, 1995; pp. 334–336.

"Barrier Against Copper Diffusion into Silicon and Drift Through Silicon Dioxide;" Shi–Qing Wang; MRS Bulletin/Aug. 1994; pp. 30–40.

(List continued on next page.)

*Primary Examiner*—John Niebling
*Assistant Examiner*—Thomas G. Bilodeau
*Attorney, Agent, or Firm*—Kidd & Booth

[57] ABSTRACT

A method or utilizing electroless copper deposition to selectively form encapsulated copper plugs to connect conductive regions on a semiconductor. A via opening in an inter-level dielectric (ILD) provides a path for connecting two conductive regions separated by the ILD. Once the underlying metal layer is exposed by the via opening, a SiN or SiON dielectric encapsulation layer is formed along the sidewalls of the via. Then, a contact displacement technique is used to form a thin activation layer of copper on a barrier metal, such as TiN, which is present as a covering layer on the underlying metal layer. After the contact displacement of copper on the barrier layer at the bottom of the via, an electroless copper deposition technique is then used to auto-catalytically deposit copper in the via. The electroless copper deposition continues until the via is almost filled, but leaving sufficient room at the top in order to form an upper encapsulation layer. The SiN or SiON sidewalls, the bottom barrier layer and the cap barrier layer function to fully encapsulate the copper plug in the via. The plug is then annealed.

32 Claims, 5 Drawing Sheets

OTHER PUBLICATIONS

"Inlaid Copper Multilevel Interconnections Using Planarization by Chemical–Mechanical Polishing;" S.P. Murarka et al.; MRS Bulletin/Jun. 1993; pp. 46–51.

"Electrochemically Deposited Diffusion Barriers;" M. Paunovic; et al.; J. Electrochem Soc., vol. 141 No. 7; Jul. 1994; pp. 1843–1850.

"Electroless Copper Deposition For Multilevel Metallization;" S. Simon Wong et al.; Mat. Res. Soc. Symp. Proc. vol. 203; 1991 Materials Research Society; pp. 347–356.

"Electroless plating of copper at a low pH level;" R. Jagannathan et al.; IBM J. Res. Develop. vol. 37 No. 2; Mar. 1993; pp. 117–123.

"Selective Electroless Metal Deposition for Integrated Circuit Fabrication;" Chiu H. Ting et al.; J. Electrochem. Soc. vol. 136, No. 2; Feb. 1989; pp. 456–462.

"Selective Electroless Metal Deposition for Via Hole Filling in VLSI Multilevel Interconnection Structures;" Chiu H. Ting et al.; J. Electrochem. Soc., vol. 136, No. 2; Feb. 1989; pp. 462–466.

"Pd/Si plasma immersion ion implantation for selective electroless copper plating on SiO2;" M.–H. Kiang et al.; Appl. Phys. Lett. 60(22); Jun. 1, 1992; pp. 2767–2769.

"Selective electroless Ni deposition on a TiW underlayer for integrated circuit fabrication;" V.M. Dubin et al.; Thin Solid Films, 226(1993); pp. 87–93.

"Copper Corrosion With and Without Inhibitors;" V. Brusic et al.; J. Electrochem. Soc., vol. 138, No. 8; Aug. 1991; pp. 2253–2259.

"100 nm wide copper lines made by selective electroless deposition;" Yosi Shacham–Diamand; J. Micromech. Microeng. 1 (1991); pp. 66–72.

"Passivation of Copper by Silicide Formation In Dilute Silane;" S. Hymes et al.; Conf. Proc. ULSI–VII, Materials Research Society; 1992; pp. 425–431.

"A Half–Micron Pitch Cu Interconnection Technology;" Kazuyoshi Ueno et al.; 1995 Symposium on VLSI Technology Digest of Technical Papers; 1995; pp. 27–28.

SELECTIVE ELECTROLESS COPPER DEPOSITED INTERCONNECT PLUGS FOR ULSI APPLICATIONS

BACKGROUND OF THE INVENTION

1. Field of the Invention

The present invention relates to the field of semiconductor manufacturing techniques and, more particularly, to a technique for selectively fabricating copper interconnect plugs by electroless metallization.

2. Prior Art

In the manufacture of devices on a semiconductor wafer, it is now the practice to fabricate multiple levels of conductive (typically metal) layers above a substrate. The multiple metallization layers are employed in order to accommodate higher densities as device dimensions shrink well below one micron design rules. Thus, semiconductor "chips" having three and four levels of metallization are becoming more prevalent as device geometries shrink to sub-micron levels.

One common metal used for forming metal lines (also referred to as wiring) on a wafer is aluminum. Aluminum is used because it is relatively inexpensive compared to other conductive materials, it has low resistivity and is also relatively easy to etch. Aluminum is also used as a material for forming interconnections in vias to connect the different metal layers. However, as the size of via/contact holes is scaled down to a sub-micron region, the step coverage problem appears, which has led to reliability problems when using aluminum to form the interconnection between different wiring layers. The poor step coverage in the sub-micron via/contact holes results in high current density and enhances the electromigration.

One approach to providing improved interconnection paths in the vias is to form completely filled plugs by utilizing metals, such as tungsten. Thus, many semiconductor devices fabricated utilizing the current state of VLSI (Very Large Scale Integration) technology employ the use of aluminum for the wiring and tungsten plugs for providing the interconnection between the different levels of wiring. However, there are disadvantages of using tungsten as well. Mostly, tungsten processes are complicated and appreciably expensive. Tungsten also has high resistivity. The Joule heating may enhance the electromigration of adjacent aluminum wiring. Furthermore, tungsten plugs are susceptible to the presence of voids and form poor interface with the wiring layers which usually result in high contact resistance. Another solution for the plug interconnects is the use of aluminum plugs, which can be fabricated by chemical vapor deposition (CVD) or physical vapor deposition (PVD) at elevated temperatures. The CVD aluminum is proven to be expensive and the hot PVD aluminum usually requires very high process temperatures that sometimes is not compatible with the manufacturing of integrated circuits.

One material which has received considerable attention as a replacement material for VLSI interconnect metallizations is copper. Since copper has better electromigration property and lower resistivity than aluminum, it is a more preferred material for wiring and plugs than aluminum. In addition, copper has more improved electrical properties over tungsten, making copper a desirable metal for use as plugs. However, one serious disadvantage of using copper metallization is that it is difficult to etch. Thus, where it was relatively easy to etch aluminum or tungsten after depositing them to form lines or via plugs (both wiring and plugs are referred to as interconnects), substantial additional cost and time are now required to etch copper. Accordingly, one practice has been to utilize chemical-mechanical polishing (CMP) techniques to polish away the unwanted copper material (see for example, "Inlaid Copper Multilevel Interconnections Using Planarization by Chemical-Mechanical Polishing;" S. P. Murarka et al.; MRS Bulletin; June 1993; pp. 46–51).

Another concern with the use of copper as interconnect material is its diffusion property. Since copper diffuse/drift easily in inter-level-dielectric (ILD) materials, such as $SiO_2$ based ILD materials, copper interconnect structures must be encapsulated by diffusion barrier layers. (See for example, "Barriers Against Copper Diffusion into Silicon and Drift Through Silicon Dioxide;" Shi-Qing Wang; MRS Bulletin; August 1994; pp. 30–40; "Encapsulated Copper Interconnection Devices Using Sidewall Barriers;" Donald S. Gardner et al.;1991 VMIC Conference; June 11–12, 1991; pp. 99–108; and "Copper Interconnection with Tungsten Cladding for ULSI;" J. S. H. Cho et al.; VLSI Symposium; 1991; pp. 39–40). Accordingly, it is a common practice to use diffusion barrier metals, such as titanium nitride (TiN) or titanium tungsten (TiW), as well as dielectric barrier materials, such as silicon nitride (SiN), to encapsulate copper. Typically, the use of diffusion barrier material to encapsulate copper is not limited to the copper-ILD interface, but also to interfaces with other metals as well. Thus, copper encapsulation techniques are also used to isolate copper interconnect structures (primarily copper plugs) from underlying and overlying metal layers where these metal layers are formed from other than copper (such as when aluminum is used for the wiring).

To replace the tungsten and aluminum plugs with copper plugs in VLSI (or ULSI) manufacturing, another important factor to consider is the process cost. The technique of selectively depositing copper within the via holes to form the plugs is attractive, because it eliminates the polishing (CMP) step. One technique of selectively depositing copper, as well as other metals, is the use of electroless deposition (See for example, "Electroless Cu for VLSI;" James S. H. Cho et al.; MRS Bulletin; June. 1993; pp. 31–38; "Selective Electroless Metal Deposition For Integrated Circuit Fabrication;" Chiu H. Ting et al.; J. Electrochem. Soc., 136; 1989; p. 456 et seq.; "Selective Electroless Metal Deposition For Via Hole Filling In VLSI Multilevel Interconnection Structures;" Chiu H. Ting et al.; J. Electrochem. Soc., 136; 1989; p.462 et seq.; and U.S. Pat. No. 5,240,497).

In comparison to other copper deposition techniques, electroless copper deposition is attractive due to the low processing cost and high quality of copper deposited. The equipment for performing electroless metal deposition are relatively less expensive, as compared to other semiconductor equipment for depositing metals, and the technique allows for batch processing of wafers. Thus, overall cost can be reduced by using electroless deposition. However, electroless deposition requires the activation of a surface in order to electrolessly deposit the metal, such as copper. (See for example, U.S. Pat. No. 4,574,095; "Electroless Copper Deposition on Metals and Silicides;" Cecilia Y. Mak; MRS Bulletin; August 1994; pp. 55–62; and "Development Of An Electroless Copper Deposition Bath For Via fill Applications On TiN Seed Layers;" Palmans et al.; Conference proceedings, ULSI-X, Materials research Society; 1995; pp. 87–94). Furthermore, since copper plugs need to be encapsulated in the via, the electroless deposition must be performed after the placement of a barrier layer for isolation from the adjacent dielectric material.

The present invention describes a technique of utilizing electroless metallization to selectively form copper plugs which are encapsulated from the adjacent dielectric, as well as from the adjacent wiring when aluminum wiring is used. The selective technique permits copper interconnections to be formed in vias without the requirement of CMP or etch back to remove unwanted deposits.

SUMMARY OF THE INVENTION

The present invention describes a method for utilizing electroless copper deposition to form copper plugs in via and contact openings to connect conductive regions on a semiconductor. A via opening in an inter-level dielectric (ILD) provides a path for connecting two conductive regions separated by the ILD. Typically, the conductive regions are metal layers of a multi-level metal semiconductor device.

Once the underlying metal layer is exposed by the via opening, a dielectric encapsulation layer is formed along the sidewalls of the via. The preferred materials for dielectric encapsulation are SiN and SiON. Then, a contact displacement technique is used to form a thin activation layer of copper on a barrier metal, such as TiN, which is present as a covering layer on the underlying metal layer.

After the contact displacement of copper on the barrier layer at the bottom of the via, this copper activation layer operates as a seed to allow copper to electrolessly deposit within the via. An electroless technique of the present invention is then used to auto-catalytically deposit copper in the via. The electroless copper deposition continues until the via is almost filled, but leaving sufficient room at the top in order to form an upper encapsulation layer. Subsequently, a cap layer, which functions as a barrier layer, is electrolessly deposited atop the copper.

The SiN or SiON sidewalls, the bottom barrier layer and the cap barrier layer function to fully encapsulate the copper plug in the via. The wafer is then annealed to improve the electrical properties of the plugs.

DETAILED DESCRIPTION OF THE PREFERRED EMBODIMENTS

A technique for utilizing selective electroless metallization to form copper (Cu) interconnect structures in vias (interconnect structures within vias are referred to as plugs) for fabrication of multilevel semiconductor devices is described. In the following description, numerous specific details are set forth, such as specific materials, structures, chemicals, processes, etc., in order to provide a thorough understanding of the present invention. However, it will be obvious to one skilled in the art that the present invention may be practiced without these specific details. In other instances, well known processes and structures have not been described in detail in order not to unnecessarily obscure the present invention.

Furthermore, it is appreciated that the fabrication of a multiple-metal layer structure atop a wafer substrate, such as a silicon substrate, to manufacture a semiconductor device is well-known in the art. Generally, dielectric materials, such as silicon dioxide ($SiO_2$), are utilized to separate the conductive regions. Contact openings are formed in the dielectric overlying the substrate region to provide conductive pathways to the source, drain and gate regions from a first metal layer. Via openings are formed in the subsequent inter-level dielectric (ILD) layers separating the various metal layers to provide conductive pathways between the metal layers. One such exemplary multiple metal layer structure is described in "Planar Copper-Polyimide Back End Of The Line Interconnections For ULSI Devices;" B. Luther et al.; 1993 VMIC Conference; June 8–9, 1993; pp. 15–21. Accordingly, it is appreciated that the Figures provided herein illustrate only portions of an exemplary semiconductor device which pertain to the practice of the present invention. Thus, the present invention is not limited to the structure described herein.

Figure 1:
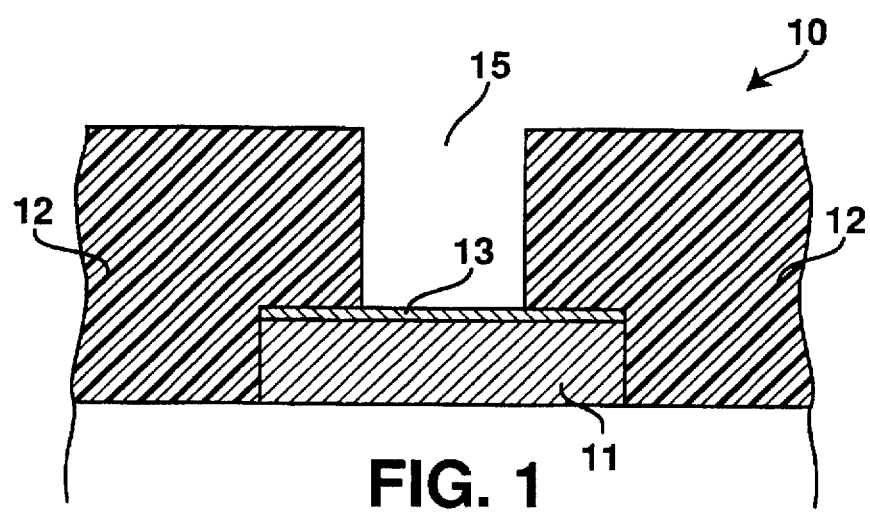
FIG. 1 is a cross-sectional view of an interconnect structure for a semiconductor device showing an underlying metal layer and a barrier layer, disposed on a dielectric layer and over laid with an inter-level dielectric (ILD) layer, but in which a via opening is formed in the ILD layer to expose a portion of the underlying barrier layer.

Referring to FIG. 1, an exemplary semiconductor structure 10 is shown having a metal layer 11 which is covered by an ILD layer 12. Metal layer 11 is representative of one of the metal layers in a multiple metal level semiconductor device. Layer 12 is typical of an ILD layer separating the different metal layers. ILD layer 12 is typically formed from an oxide material, such as silicon dioxide ($SiO_2$). It is appreciated that other materials, such as low dielectric constant materials, polymer and polyimide materials, as well as other non-conductive materials, can be utilized for ILD layer 12. Generally, metal 11 resides atop a dielectric material (which could be part of layer 12), but what comprises the underlying material is not critical to the understanding of the practice of the present invention. Also, it is understood that structure 10 is only a portion of many structures present on a semiconductor wafer.

In the following discussion, it is presumed that the metal wiring layers (metal lines) are fabricated so that a barrier layer is present to separate the copper plug material in via openings from the metal layers forming the wiring. Typical practice is to utilize aluminum as the material for the metal lines. When aluminum wiring is used, titanium nitride (TiN) is generally used as an anti-reflection coating layer as well as an electromigration/stress migration suppression layer for the aluminum wiring layer. Accordingly, if metal layer 11 is aluminum, it will have a titanium nitride layer overlying it, so that this titanium nitride layer is noted as layer 13 and will function as a barrier between the aluminum metal and the copper plug. If the wiring is made from copper, then the overlying metal can be TiN, titanium tungsten (TiW), tantalum (Ta), TaN or WN. However, in the description of the present invention, it is presumed that the material used for layer 13 is TiN, since it is presumed that the underlying metal is aluminum. Whether the metal layer 11 is fabricated from aluminum or copper (or some other metal), a barrier layer 13 is formed overlying the metal layer 11. Layer 13 (also referred to as barrier layer 13 herein) is presumed to be TiN and is deposited to a typical thickness of about 200–500 angstroms. The deposition of titanium nitride to form TiN layer 13 is known in the art.

Subsequently, by the use of a well-known process, a via opening (also, via hole or via) 15 is made in ILD 12 in order to provide a pathway to barrier layer 13 and metal 11. The via opening 15 will be eventually filled with a conductive material to form an interconnect plug between metal 11 and an overlying metal layer which will be formed above the ILD layer 12. It is appreciated that the structure 10 of FIG. 1 can be fabricated from a variety of known processes. It is also appreciated that etching process for the formation of the via hole 15 be optimized so that the etch process stops when the TiN layer 13 is reached. The optimization is preferred in order not to etch away the TiN layer 13 at the bottom of the via hole 15.

Figure 2:
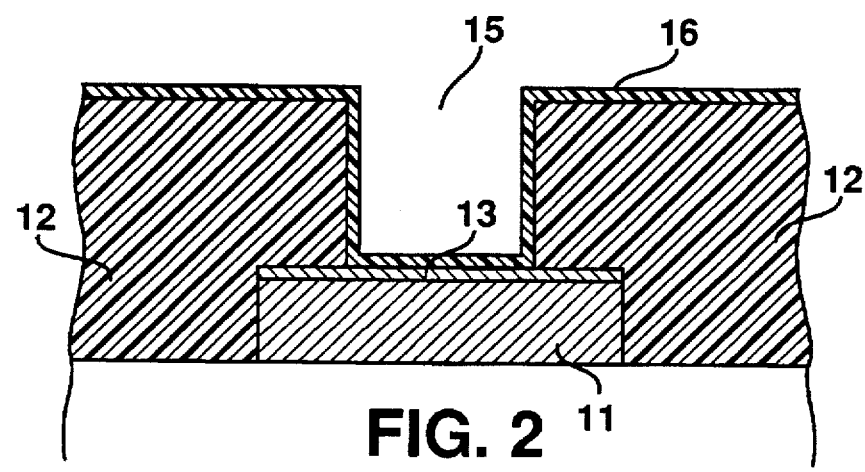
FIG. 2 is a cross-sectional view showing a formation of a SiN or SiON layer over the ILD layer and also within the via opening of the structure of FIG. 1.

Referring to FIGS. 2–6, a technique of the present invention for forming a copper plug by a technique of selective electroless deposition of copper is described. In FIG. 2, a dielectric encapsulation layer is formed along the sidewalls of via opening 15 in order to inhibit copper migration into the ILD 12. Accordingly, after patterning and forming via hole 15 to expose the TiN layer 13, a dielectric layer 16 is conformally blanket deposited on the wafer over ILD layer 12 and the exposed portions of TiN layer 13 within via 15. In the preferred technique, silicon nitride (SiN) or silicon oxynitride (SiON) is deposited by a chemical vapor deposition (CVD) technique to a thickness of approximately 500–1500 angstroms. The CVD deposited layer 16 has good step coverage and conformity over the via opening 15.

Figure 3:
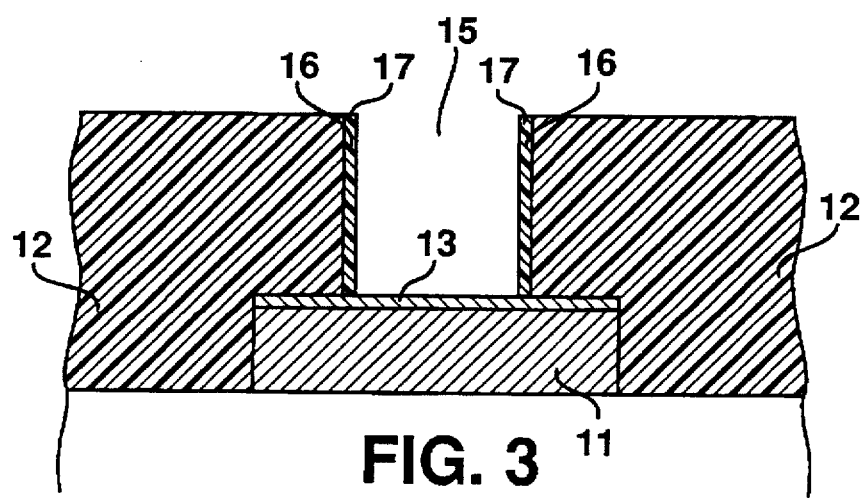
FIG. 3 is a cross-sectional view showing a formation of a SiN or SiON sidewall within the via opening of FIG. 2 after an anisotropic etch of the SiN or SiON layer.

Next, as shown in FIG. 3, an anisotropic etch is performed to remove the SiN or SiON layer 16 on the surface of the wafer and at the bottom of the via 15. In the practice of the present invention, reactive ion etching (RIE) is used to anisotropically etch layer 16. Due to the anisotropic etching, the SiN or SiON layer 16 remains on the vertical sidewalls 17 of via 15. The selectivity of the anisotropic dielectric etch over TiN must be carefully maximized in order to retain the TiN layer 13 at the bottom of the via 15. With the presently described technique, approximately 50% (250–750 angstroms) of the SiN or SiON material will remain as sidewall layer 17 on the sidewalls of via 15.

Figure 4:
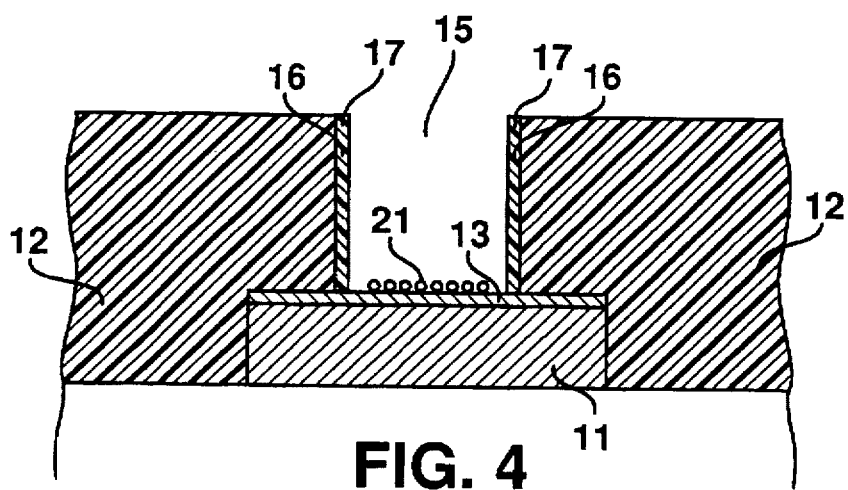
FIG. 4 is a cross-sectional view showing the structure of FIG. 3 in which the exposed barrier layer is activated by contact displacement for the electroless deposition of copper.

Subsequently, as shown in FIG. 4, a technique of the present invention is used to activate the surface of TiN layer 13 by a method of contact displacement of copper. As is known in the art, activation of a metal is necessary in order to pursue the autocatalytic reaction for the electroless deposition of copper. A number of techniques are known for treating a metal surface in order to make the surface susceptible for the autocatalytic reaction. The use of palladium (or palladium seeds) is one known technique for treating a surface to start the autocatalytic reaction of copper. (See for example, "Development Of An Electroless Copper Deposition Bath For Via Fill Applications On TiN Seed Layers;" Palmans et al.; Conference Proceedings, ULSI-X; Materials Research Society; 1995; pp. 87–94). However, a problem of this one technique resides in the use of palladium (Pd). The presence of Pd will reduce the stability of electroless Cu deposition solution and the formation of CuPd alloy increases the resistivity of electroless Cu deposits.

Accordingly, in order to activate the exposed TiN surface, the present invention uses copper as the activation material for activating the surface by contact displacement. The surface of the TiN layer 13 is activated by having a formation of copper atoms 21 attached to its surface by contact displacement, as shown in FIG. 4. It is appreciated that the preferred material for barrier layer 13 is TiN, but other metallic barrier material can be used as well, provided that the copper activation of the surface can be achieved by contact displacement.

In the practice of the present invention, the complete wafer (incorporating the structure) is subjected to one of two techniques for the formation of the copper layer 21 on the surface of the TiN layer 13. The wafer can be dipped in a wet bath containing a contact displacement deposition solution (technique of immersion deposition) or the wafer can be placed on a rotating chuck where the contact displacement solution is injected on to the rotating wafer (technique of spin or shower deposition).

With either technique noted, a variety of solutions acceptable for semiconductor use to permit copper atoms 21 to adhere to the TiN surface 13 by contact displacement can be used. In the preferred embodiment, the aqueous contact displacement solution is formed having de-ionized (DI) water as the main component of the solution. The various chemicals noted below are then added to the DI water in quantities noted. The solution is further comprised of 0.001–2 mol/liter of $Cu^{+2}$ ions, 0.001–5 mol/liter of $F^-$ ions and 0.01–10 gm/liter of surfactant material. The particular solution utilized in the practice of the present invention includes copper sulfate ($CuSO_4$) and hydrofluoric acid (HF) to provide the copper and fluorine ions. The particular surfactant used in the solution is comprised of RHODAFAC RE 610 (manufactured by Rhone-Poulenc), polyethylene glycol and Triton X-100 (both manufactured by Aldrich). The exposed TiN is subjected to this solution for a time period of approximately 1–600 seconds at a temperature in the approximate range of 18–25° C. The parameters can be varied, but ultimately it is desirable to form a copper activation layer 21, having at least a mono-layer of copper atoms to cover the surface of TiN layer 13. Then, the wafer is removed from the contact displacement solution and rinsed in DI water.

It is appreciated that by utilizing the above contact displacement process, a copper activation layer 21 is formed on the surface of the TiN layer 13, so that now an autocatalytic deposition of electrolessly deposited copper can occur on the TiN layer 13, once the wafer is placed in an electroless deposition solution. It is to be noted that the contact displacement technique is described in reference to TiN, since TiN is the preferred barrier material for aluminum metal, but the same copper contact displacement technique can be used with other barrier metals (including those noted earlier) to activate the metal surface for copper deposition.

Examples of metals, other than TiN, in which copper activation can occur by contact displacement are Al, AlCu, AlSiCu, Ti, Ta, TaN, W, WN and TiW. Thus, depending on the purpose and the process, layer 13 can be comprised of one of these other materials, instead of TiN. After the activation process, the wafer is rinsed in DI water to remove the activation solution. Copper activation of TiN barrier layer by contact displacement is also described in a patent application titled "Electroless Cu Deposition On A Barrier Layer By Cu Contact Displacement For ULSI Applications;" Ser. No. 08/587,262; filed Jan. 16, 1996, which is incorporated by reference herein.

Figure 5:
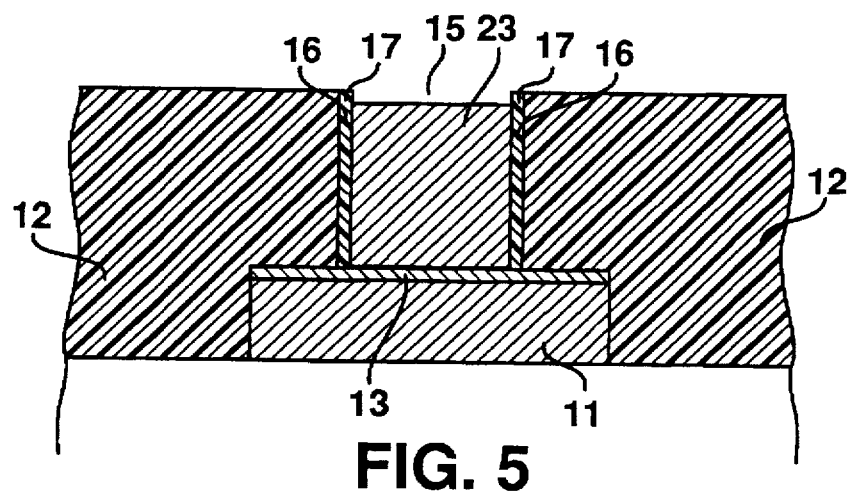
FIG. 5 is a cross-sectional view of the structure of FIG. 4 in which copper is electrolessly deposited within the via opening.

Subsequently, as shown in FIG. 5, copper is deposited by the technique of selective electroless deposition of copper to form plug 23. The electroless deposition of copper occurs at those locations where copper atoms 21 have activated the TiN surface, which in this instance is at the bottom of via 15 only. Thus, as shown in FIG. 5, a selective growth of electrolessly deposited copper forms from TiN layer 13 to selectively fill via opening 15. One of a variety of known electroless copper deposition solutions can be utilized to electrolessly deposit copper on layer 13. However, with the practice of the present invention, the electroless copper deposition to selectively form plug 23 is performed in the following solution.

The electroless solution of the preferred embodiment is comprised of copper sulfate to supply the $Cu^{2+}$ cations, ethylenediaminetetraacetic acid (EDTA) as a complexing agent for $Cu^{2+}$ cations, quaternary ammonium hydroxides to supply the $OH^-$, formaldehyde (HCHO) or glyoxylic acid as a reducing agent, RHODAFAC RE 610 or polyethylene glycols as a surfactant and wetting agent, and ammonium cyanide or 2,2"-dipyridyl as stabilizer and ductility promoter.

The particular solution concentration for the solution of the preferred embodiment is mixed in DI water and is comprised of 0.016–0.08 mol/liter of copper sulfate ($CuSO_4$), 0.04–0.2 mol/liter of EDTA, 0.13–1 mol/liter of formaldehyde, 0.06–0.2 mol/liter of glyoxylic acid, 0.01 mol/liter of ammonium cyanide, 10–120 parts-per-million (ppm) of 2,2'-dipyridyl, 50–100 ppm of polyethylene glycol and 0.01–10 gm/liter of RHODAFAC RE 610. Also, sufficient tetramethylammonium hydroxide (TMAH) is added to adjust the pH of the solution to a range of 11–13. The electroless bath is maintained at a temperature in the range of 30°–80° C.

The amount of reducing agent and complexing agent are dependent upon the amount of cupric ions present in the solution. Electroless copper deposition reaction can be expressed as:

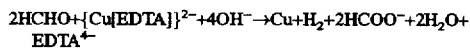

According to the above equation, the ratio between the components in the solution must be in molar as:

Then, after the electroless deposition of copper, the wafer is rinsed in DI water again to remove the electroless deposition solution. It is appreciated that the selective growth of copper is timed so that it does not over flow via opening 15. It is also preferable to stop the copper deposition before the via is completely filled. The reason for it is noted below.

Figure 6:
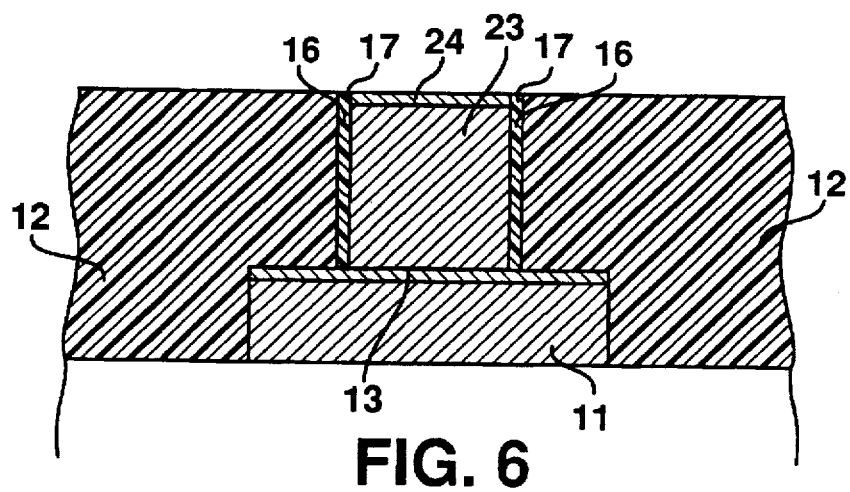
FIG. 6 is a cross-sectional view showing a selective formation of a cap barrier layer atop the copper deposit in the via opening of FIG. 5 in order to form a fully encapsulated copper plug of the present invention.

Referring to FIG. 6, a cap layer 24 is then selectively formed atop the copper plug in via 15. The cap layer 24 operates as a barrier layer to fully encapsulate the plug within via 15 and ensures that copper will not migrate out of via 15. The cap layer 24 can be formed from a variety of metals or metal alloys which have a barrier property to prevent copper diffusion. In the preferred embodiment, electrolessly deposited nickel (Ni), cobalt (Co), Ni—Co alloy, CoP, NiCoP or NiP can be used as the material for forming cap layer 24. It is also preferred that the material selected maintains a diffusion barrier at temperatures encountered in subsequent processing steps. Thus, it is preferred that the material selected for cap layer 24 can inhibit copper diffusion at least up to 400° C. in order to ensure that the diffusion barrier does not break down for most semiconductor processing steps. The cap layer 24 is grown in another bath solution after the electroless copper deposition step. After a rinse, the wafer is placed into a known electroless deposition solution, which solution will depend on the material being deposited (see for example, "Electrochemically Deposited Diffusion Barriers;" Milan Paunovic et al.; J. Electrochem. Soc., Vol. 141, No.7; July 1994; pp. 1843–1850). Typical thickness for the barrier cap layer 24 is in the approximate range of 500–1500 angstroms. Thus, it is to be noted that the cap layer 24 functions as a diffusion barrier layer at the top of plug 23.

As is shown in FIG. 6, once the plug has been completed, the formation of the SiN or SiON sidewalls 17 in via 15 functions to provide a barrier layer to prevent the diffusion of copper into the ILD 12. Thus, copper plug 23 is completely isolated from the surrounding ILD 12 by the dielectric sidewall 17. The barrier metals 13 and 24 disposed at the bottom and top of the copper plug 23 function to prevent copper diffusion into the adjacent metal layers, thereby allowing for Al wiring to be used with the copper plug. Thus, the electrolessly deposited copper plug 23 is fully encapsulated along interfaces with adjacent materials.

It is appreciated that other dielectric materials can be readily used instead of SiN or SiON for forming sidewall layers 16. The requirements for such layer 16 are that it must provide sufficient barrier isolation to inhibit copper diffusion into the adjacent ILD 12 and it must be compatible with the subsequent contact displacement process for forming the copper activation layer 21.

Furthermore, it is appreciated that by properly timing the electroless growth of copper in via 15, the deposition can be stopped prior to the top of the plug reaching the upper surface of ILD layer 12. Preferably, the electroless copper deposition is stopped below the surface with ample room for the formation of cap layer 24. Forming the cap layer 24 within via opening 15 so that the upper surface of cap layer 24 is substantially planar with the surface of ILD layer 12 completes the plug formation. Subsequent CMP steps to polish and planarize the upper surface of the plug is not needed. It is appreciated that some amount of overgrowth can be tolerated, however, any significant overgrowth will require CMP to planarize the surface for proper Cu encapsulation. Then, as a final step, the fully encapsulated copper plug is then annealed at a temperature in the range of 150°–200° C. in vacuum for a time period of 0.5–1 hour.

As noted, in those instances where significant overgrowth of the copper plug does occur, CMP can be used to planarize the surface of the copper plug. The preference is not to require the CMP step. It is also to be noted that in some instances, the cap layer 24 may not be needed. In those instances where a barrier layer (which forms part of the overlying metal layer) is deposited above the copper plug 23 and ILD 12, this barrier layer can be used in place of the cap barrier layer 24. In this instance, it is preferable to grow the copper plug so that the upper surface of the plug is substantially planar to the surface of the ILD where the barrier layer is to be deposited. To some extent, slight undergrowth of the plug is permitted.

Figure 7:
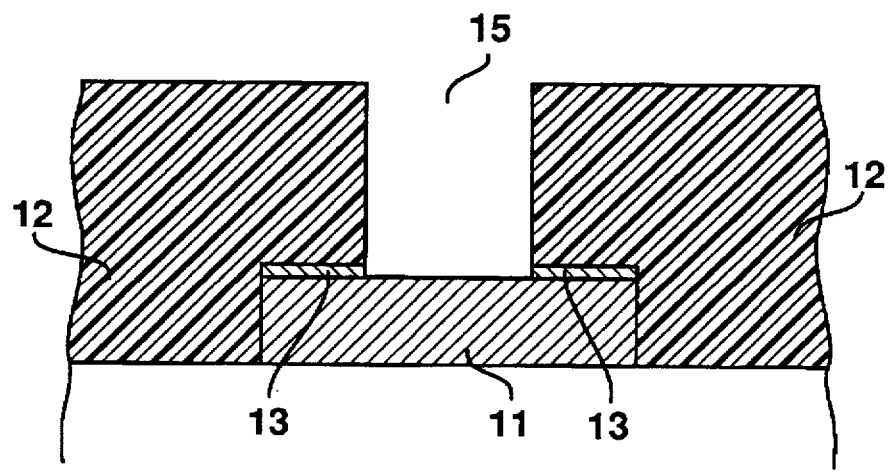
FIG. 7 is a cross-sectional view of an interconnect structure similar to the structure shown in FIG. 1, but wherein the barrier layer at the bottom of a via opening is removed, exposing the underlying metal layer.

An alternative embodiment is shown in reference to FIGS. 7–13. The structure of FIG. 7 is equivalent to the structure of FIG. 1 except that the exposed TiN layer 13 in the via opening 15 has been etched away during the etch process creating the via opening 15. This is not preferred, but may occur with certain etch chemistries and/or processes. Accordingly, the underlying metal 11 is exposed in via 15. Thus, in order to practice the present invention, an additional step of reforming a barrier layer at the bottom of via opening 15 is necessary in order to encapsulate the copper plug.

Figure 8:
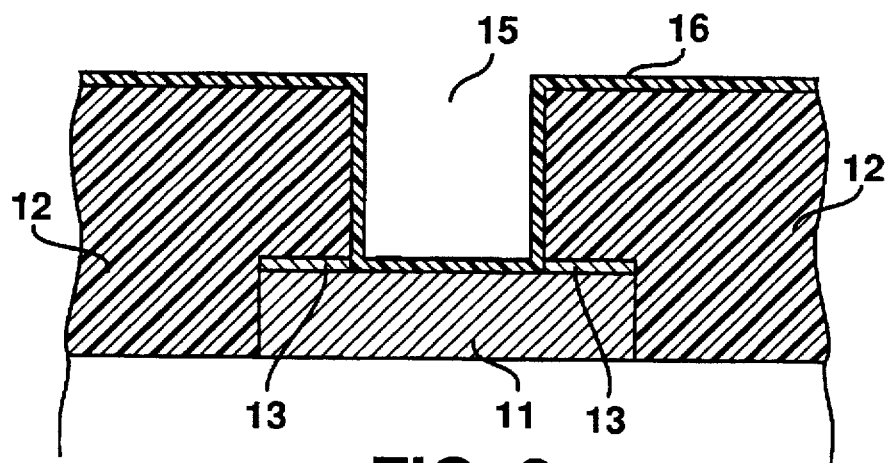
FIG. 8 is a cross-sectional view showing a formation of a SiN or SiON layer over the ILD layer and also within the via opening of the structure of FIG. 7.
Figure 9:
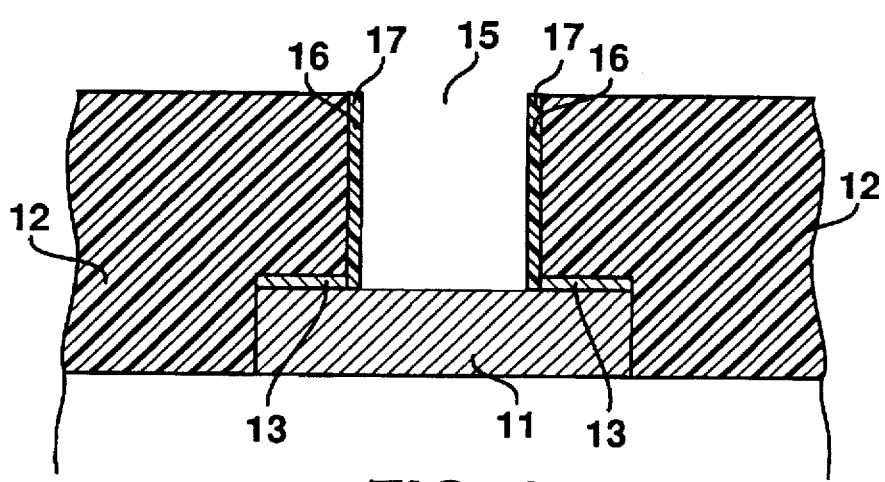
FIG. 9 is a cross-sectional view showing a formation of a SiN or SiON sidewall within the via opening of FIG. 8 after an anisotropic etch of the SiN or SiON layer.

Therefore, as shown in FIG. 8, once the via opening 15 is formed with the erosion of the TiN material at the bottom of the via 15, the SiN or SiON layer 16 is first conformally deposited as described in reference to FIG. 2. The subsequent anisotropic etch (equivalent to FIG. 3) of the SiN or SiON layer 16 is shown in FIG. 9 to form SiN or SiON sidewalls 17. As noted in FIG. 9, the metal layer 11 is still exposed at the bottom of via opening 15.

Figure 10:
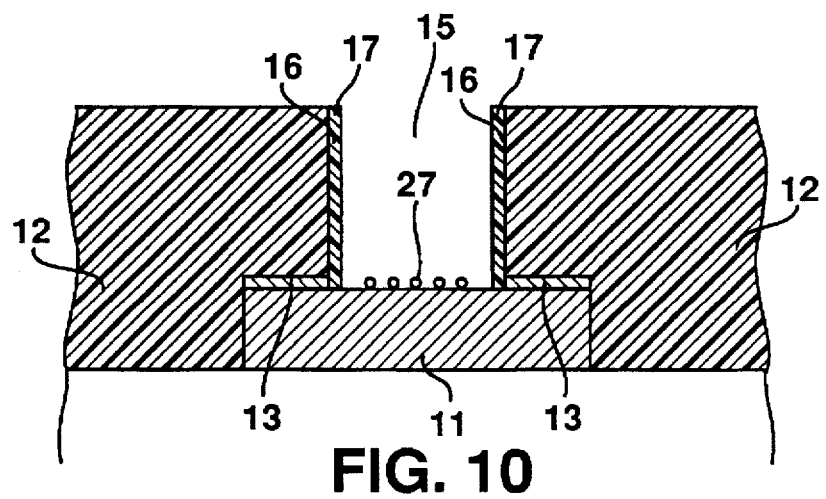
FIG. 10 is a cross-sectional view showing the structure of FIG. 9 in which the exposed metal layer is activated for an electroless deposition of a replacement barrier layer at the bottom of the via opening.
Figure 11:
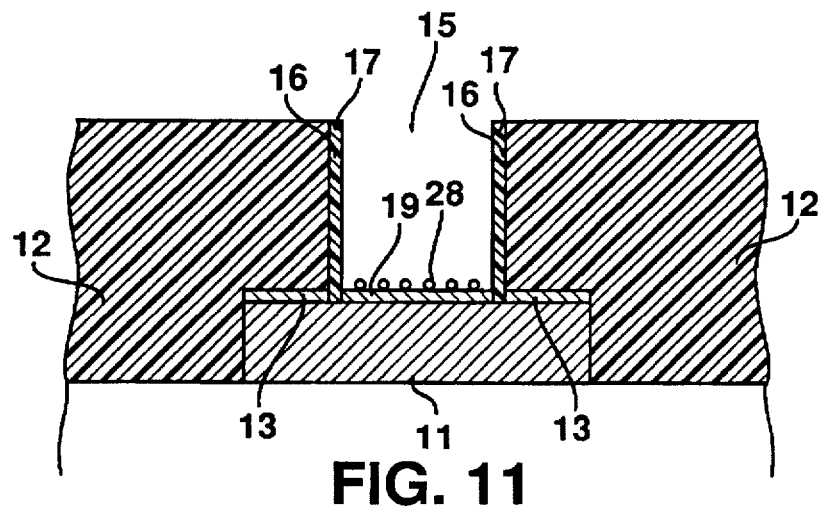
FIG. 11 is a cross-sectional view of the structure of FIG. 10 in which the bottom barrier layer is selectively formed on the activated surface of the underlying metal layer by electroless deposition and in which the upper surface of the barrier layer is activated by copper contact displacement.

Next, as shown in FIGS. 10 and 11, a metal barrier layer 19 is deposited in the bottom of the via opening 15 to prevent the diffusion of copper into the metal 11. The formation of the bottom barrier layer 19 is shown in FIG. 11. The preferred technique is to utilize electroless deposition to selectively form the barrier layer 19. If the underlying metal is aluminum, two techniques can be used to activate the aluminum to form an activation (seed) layer 27 on the aluminum, as shown in FIG. 10.

In the first approach, a solution equivalent to the solution that was used for the copper contact displacement on TiN is used to activate the aluminum surface to form the activation layer 27. In the second approach, palladium (Pd) is used to activate the aluminum surface by a known technique to form the activation layer 27 (see for example, U.S. Pat. No. 4,574,095 and "Selective Electroless Metal Deposition For Via Hole Filling In VLSI Multilevel Interconnection Structures;" C. H. Ting et al.; J. Electrochem. Soc. Vol. 136; 1989; pp. 562). The wafer is then rinsed in DI water.

After the rinse, the wafer is then subjected to an electroless deposition process equivalent to that described for the formation of cap layer 24 to selectively grow the metal barrier layer 19 comprised of one of the materials mentioned for the formation of cap barrier layer 24. Thus, the barrier layer 19 is electrolessly deposited on the activated surface 27 of metal layer 11. As noted above, the preference is to use electrolessly deposited nickel (Ni), cobalt (Co), Ni—Co alloy, CoP, NiCoP or NiP to selectively form barrier layer 19.

Next, after a rinse in DI water, one of two approaches is taken to electrolessly grow copper atop barrier layer 19. If the barrier layer 19 is not catalytic to electroless copper growth, then the surface of the barrier layer 19 is first activated. The preferred approach is to use the aforementioned copper contact displacement solution to form an activation layer 28 by contact displacement of copper atop barrier layer 19, as shown in FIG. 11. Once the barrier layer 19 is activated, the electroless copper deposition can occur to form plug 23, as shown in FIG. 12.

If the barrier layer 19 material is catalytic for the subsequent electroless copper growth, the surface of the barrier layer 19 need not be treated (activated) in a separate step to form the activation layer 28. For example, Ni, Co, and their alloys are catalytic when the reducing agent is dimethylamine borane (DMAB). One typical electroless Cu deposition solution using DMAB as a reducing agent can be found in "Electroless plating of copper at a low pH level;" R. Jagannathan et al.; IBM J. Res. Develop. Vol. 37, No. 2; March 1993; pp. 117–123. Thus, with a catalytic barrier layer 19, the wafer can be subjected to the electroless copper deposition solution without first having the surface of the barrier layer 19 activated.

Figure 12:
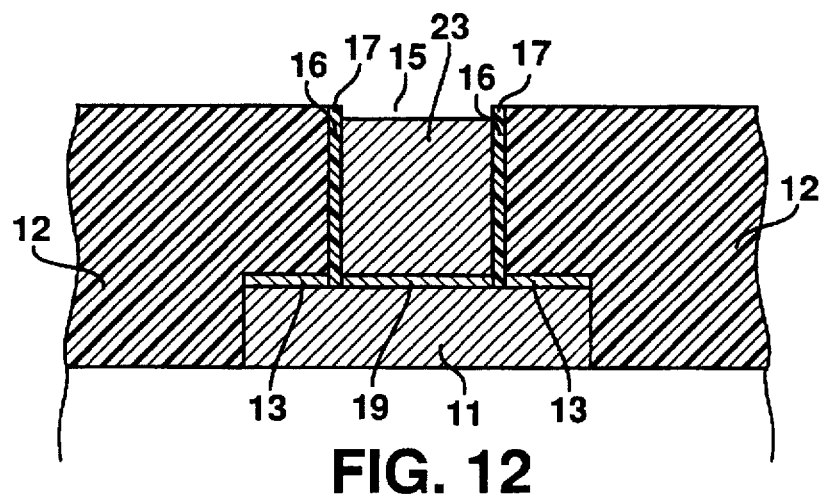
FIG. 12 is a cross-sectional view of the structure of FIG. 11 in which copper is electrolessly deposited within the via opening atop the newly formed bottom barrier layer.
Figure 13:
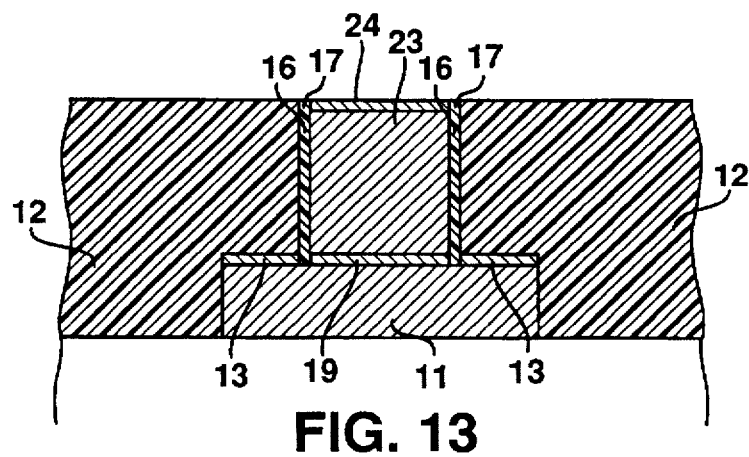
FIG. 13 is a cross-sectional view showing a selective formation of a cap barrier layer atop the copper deposit in the via opening of FIG. 12 in order to form an alternative, fully encapsulated copper plug of the present invention.

By the use of either technique which is appropriate (with or without the activation of barrier layer 19), copper is electrolessly deposited atop barrier layer 19 to form plug 23, as shown in FIG. 12. Again, the copper deposition is preferably stopped before the copper reaches the top of via opening, as shown in FIG. 12. Finally, as shown in FIG. 13, a cap layer 24 is selectively formed atop the copper plug 23 to fully encapsulate it (equivalent to FIG. 6). The fully encapsulated copper plug is then annealed as previously described. Again, it is appreciated that variations to this approach, as noted previously, are possible, including the use of a subsequent barrier layer of an overlying metal layer to isolate the copper plug at the upper surface. Accordingly, this alternative technique still allows the present invention to be practiced in the event the original barrier layer 13 overlying the metal layer 11 at the bottom of the via is removed.

Figure 14:
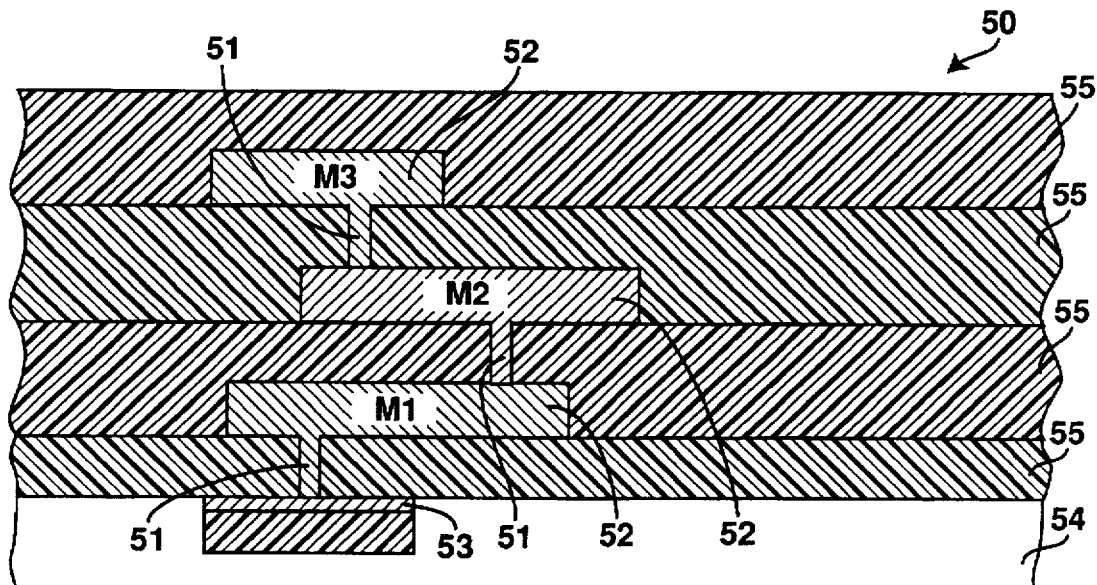
FIG. 14 is a cross-sectional view of a semiconductor device having four metal layers and a doped region in a substrate and in which via and contact openings are filled to interconnect the various conductive regions.

FIG. 14 shows a three-metal level structure 50 in which the metal levels are designated M1, M2 and M3, separated by dielectric layers 55. Plugs 51 are used to couple the metal lines 52 to each other and the Mr level to a contact region 53 on a substrate 54. It is appreciated that the present invention can be readily used to provide for the various plugs 51 shown in FIG. 14 in the fabrication of semiconductor devices.

Accordingly, an electroless copper deposition technique is described in which advantages associated with the use of copper for conductive paths in a semiconductor device are inherently present in the practice of the present invention. The present invention is not limited to the size of the device or the via opening, but has advantages at smaller sized dimensions in the submicron range (typically in the approximate range of 0.2–0.8 µm). Thus, the practice of the present invention allows higher aspect ratio structures, including vias, to be fabricated. Furthermore, with the use of the preferred technique of the present invention, CMP is not needed to planarize the plug surface after the selective formation of the plug in the via opening. The electroless copper deposition can be performed as a batch process in which a substantial number of wafers can be immersed in the wet bath at the same time.

Thus, a technique for utilizing electroless metallization to selectively deposit copper for use in forming fully encapsulated copper plugs is described.

We claim:

1. A method of selectively forming an interconnect structure on a semiconductor wafer to couple a first conductive region to a second conductive region and in which said two conductive regions are separated by a dielectric layer, comprising the steps of:

forming an opening in said dielectric layer to expose a first barrier layer overlying said first conductive region;

depositing a dielectric barrier layer within said opening;

anisotropically etching said dielectric barrier layer so that said dielectric barrier layer remains along sidewalls of said opening, but not atop said first barrier layer;

activating a surface of said first barrier layer for autocatalytic growth of copper by forming a copper activation seed layer on said first barrier layer;

subjecting said copper activation seed layer to an electroless deposition solution;

depositing copper electrolessly on said first barrier layer by having said copper activation seed layer initiate said autocatalytic growth of copper to form said interconnect structure.

2. The method of claim 1 wherein said dielectric barrier layer is formed by depositing silicon nitride (SiN) or silicon oxynitride (SiON).

3. The method of claim 2 wherein said first barrier layer is a titanium nitride (TiN) layer or a tantalum (Ta) layer and wherein said first barrier layer is subjected to an aqueous copper contact displacement solution to activate its surface by contact displacement to form said copper activation seed layer.

4. The method of claim 3 wherein said aqueous copper contact displacement solution includes copper sulfate (CuSO$_4$) and hydrofluoric acid (HF) to provide necessary copper and fluorine ions for said contact displacement of copper to occur.

5. The method of claim 4 wherein said aqueous copper contact displacement solution is further comprised of 0.001–2 mol/liter of $Cu^{+2}$ ions, 0.001–5 mol/liter of $F^-$ ions and 0.01–10 gm/liter of surfactant material mixed in deionized water and said step of subjecting said first barrier layer to said aqueous copper contact displacement solution occurs for approximately 1–600 seconds at an approximate temperature of 18–25 degrees C.

6. The method of claim 3 further including the step of depositing a cap metal barrier layer atop said electrolessly deposited copper to fully encapsulate said electrolessly deposited copper, said electrolessly deposited copper being surrounded by said first barrier layer, dielectric barrier layer and cap barrier layer.

7. The method of claim 6 wherein said cap metal barrier layer is formed by electrolessly depositing Ni, Co, Ni—Co alloy, CoP, NiCoP or NiP atop said electrolessly deposited copper.

8. The method of claim 2 further including the step of depositing a cap metal barrier layer atop said electrolessly deposited copper to fully encapsulate said electrolessly deposited copper, said electrolessly deposited copper being surrounded by said first barrier layer, dielectric barrier layer and cap barrier layer.

9. The method of claim 8 wherein said cap metal barrier layer is formed by electrolessly depositing Ni, Co, Ni—Co alloy, CoP, NiCoP or NiP atop said electrolessly deposited copper.

10. A method of selectively forming an interconnect plug structure on a semiconductor wafer to interconnect a lower conductive layer to an upper conductive layer and in which said two conductive layers are separated by a dielectric layer, comprising the steps of:

forming a via opening in said dielectric layer to expose a first barrier layer overlying said lower conductive layer;

depositing conformally a dielectric barrier layer within said via opening;

anisotropically etching said dielectric barrier layer so that said dielectric barrier layer remains along sidewalls of said via opening, but not atop said first barrier layer;

activating a surface of said first barrier layer for autocatalytic growth of copper by forming a copper activation seed layer on said first barrier layer;

subjecting said copper activation seed layer to an electroless deposition solution;

depositing copper electrolessly on said first barrier layer by having said copper activation seed layer initiate said autocatalytic growth of copper to form said interconnect plug structure.

11. The method of claim 10 wherein said dielectric barrier layer is formed by depositing silicon nitride (SiN) or silicon oxynitride (SiON).

12. The method of claim 11 wherein said first barrier layer is a titanium nitride (TiN) layer or a tantalum (Ta) layer and wherein said first barrier layer is subjected to an aqueous copper contact displacement solution to activate its surface by contact displacement to form said copper activation seed layer.

13. The method of claim 12 further including the step of depositing a cap metal barrier layer atop said electrolessly deposited copper to fully encapsulate said electrolessly deposited copper, said electrolessly deposited copper being surrounded by said first barrier layer, dielectric barrier layer and cap barrier layer.

14. The method of claim 11 further including the step of depositing a cap metal barrier layer atop said electrolessly deposited copper to fully encapsulate said electrolessly deposited copper, said electrolessly deposited copper being surrounded by said first barrier layer, dielectric barrier layer and cap barrier layer.

15. A method of selectively forming an interconnect structure on a semiconductor wafer to couple a first conductive region to a second conductive region and in which said two conductive regions are separated by a dielectric layer, comprising the steps of:

forming an opening in said dielectric layer to expose said first conductive region;

depositing a dielectric barrier layer within said opening;

anisotropically etching said dielectric barrier layer so that said dielectric barrier layer remains along sidewalls of said opening, but not atop said first conductive region;

activating a surface of said first conductive region for electroless growth of a barrier metal;

subjecting said surface of said conductive region to a first electroless deposition solution to deposit a bottom metal barrier layer in said opening and atop said first conductive region;

subjecting said bottom barrier layer to a second electroless deposition solution to electrolessly deposit copper;

depositing copper electrolessly on said bottom barrier layer to form said interconnect structure.

16. The method of claim 15 wherein said dielectric barrier layer is formed by depositing silicon nitride (SiN) or silicon oxynitride (SiON).

17. The method of claim 16 wherein said first conductive region is comprised of aluminum (Al) and wherein a surface of said Al is first activated and then subjected to said first electroless deposition solution to deposit said bottom metal barrier layer.

18. The method of claim 17 wherein said bottom metal barrier layer is formed by electrolessly depositing Ni, Co, Ni—Co alloy, CoP, NiCoP or NiP.

19. The method of claim 18 further including the step of depositing a cap metal barrier layer atop said electrolessly deposited copper to fully encapsulate said electrolessly deposited copper, said electrolessly deposited copper being surrounded by said bottom barrier layer, dielectric barrier layer and cap barrier layer.

20. The method of claim 19 wherein said cap metal barrier layer is formed by electrolessly depositing Ni, Co, Ni—Co alloy, CoP, NiCoP or NiP atop said electrolessly deposited copper.

21. The method of claim 16 further including the step of depositing a cap metal barrier layer atop said electrolessly deposited copper to fully encapsulate said electrolessly deposited copper, said electrolessly deposited copper being surrounded by said bottom barrier layer, dielectric barrier layer and cap barrier layer.

22. The method of claim 21 wherein said cap metal barrier layer is formed by electrolessly depositing Ni, Co, Ni—Co alloy, CoP, NiCoP or NiP atop said electrolessly deposited copper.

23. The method of claim 17 further including the step of activating said bottom barrier layer for electroless copper deposition prior to subjecting said bottom barrier layer to said second electroless deposition solution.

24. A method of selectively forming an interconnect plug structure on a semiconductor wafer to interconnect a lower conductive layer to an upper conductive layer and in which said two conductive layers are separated by a dielectric layer, comprising the steps of:

forming a via opening in said dielectric layer to expose said lower conductive layer;

depositing conformally a dielectric barrier layer within said via opening;

anisotropically etching said dielectric barrier layer so that said dielectric barrier layer remains along sidewalls of said via opening, but not atop said lower conductive layer;

activating a surface of said lower conductive layer for electroless growth of a barrier metal;

subjecting said surface of said lower conductive layer to a first electroless deposition solution to deposit a bottom metal barrier layer in said via opening and atop said bottom barrier lower conductive layer;

subjecting said bottom barrier layer to a second electroless deposition solution to electrolessly deposit copper;

depositing copper electrolessly on said bottom metal barrier layer to form said interconnect plug structure.

25. The method of claim 24 wherein said dielectric barrier layer is formed by depositing silicon nitride (SiN) or silicon oxynitride (SiON).

26. The method of claim 25 wherein said lower conductive layer is comprised of aluminum (Al) and wherein a surface of said Al is first activated and then subjected to said first electroless deposition solution to deposit said bottom metal barrier layer.

27. The method of claim 26 wherein said bottom metal barrier layer is formed by electrolessly depositing Ni, Co, Ni—Co alloy, CoP, NiCoP or NiP.

28. The method of claim 27 further including the step of depositing a cap metal barrier layer atop said electrolessly deposited copper to fully encapsulate said electrolessly deposited copper, said electrolessly deposited copper being surrounded by said bottom barrier layer, dielectric barrier layer and cap barrier layer.

29. The method of claim 28 wherein said cap metal barrier layer is formed by electrolessly depositing Ni, Co, Ni—Co alloy, CoP, NiCoP or NiP atop said electrolessly deposited copper.

30. The method of claim 25 further including the step of depositing a cap metal barrier layer atop said electrolessly deposited copper to fully encapsulate said electrolessly deposited copper, said electrolessly deposited copper being surrounded by said bottom barrier layer, dielectric barrier layer and cap barrier layer.

31. The method of claim 30 wherein said cap metal barrier layer is formed by electrolessly depositing Ni, Co, Ni—Co alloy, CoP, NiCoP or NiP atop said electrolessly deposited copper.

32. The method of claim 26 further including the step of activating said bottom barrier layer for electroless copper deposition prior to subjecting said bottom barrier layer to said second electroless deposition solution.

* * * * *

UNITED STATES PATENT AND TRADEMARK OFFICE
CERTIFICATE OF CORRECTION

PATENT NO. : 5,674,787
DATED : October 7, 1997
INVENTOR(S) : Zhao et al.

It is certified that error appears in the above-identified patent and that said Letters Patent is hereby corrected as shown below:

Column 1, line 53, "is" should be -- are --.
Column 2, line 61, "research" should be --Research--.

In the claims:
  Claim 24, Column 13, line 34, remove "bottom barrier".

Signed and Sealed this

Twenty-fourth Day of February, 1998

Attest:

BRUCE LEHMAN

Attesting Officer    Commissioner of Patents and Trademarks

UNITED STATES PATENT AND TRADEMARK OFFICE
CERTIFICATE OF CORRECTION

PATENT NO : 5,674,787
DATED : October 7, 1997
INVENTOR(S): Zhao et al.

It is certified that error appears in the above-identified patent and that said Letters Patent is hereby corrected as shown below: On the title page: Item [73]

Please add Cornell Research Foundation, Inc. and Intel Corporation to the Assignees listed on the cover of the patent. The Assignees should now read:

Assignee: Sematech, Inc., Austin, TX;
Cornell Research Foundation, Inc. Ithaca, NY;
Intel Corporation, Santa Clara, CA.

Signed and Sealed this

Thirteenth Day of October 1998

*Attest:*

BRUCE LEHMAN

*Attesting Officer*     *Commissioner of Patents and Trademarks*